(12) United States Patent
Perner et al.

(10) Patent No.: US 6,363,000 B2
(45) Date of Patent: Mar. 26, 2002

(54) WRITE CIRCUIT FOR LARGE MRAM ARRAYS

(75) Inventors: Frederick A Perner, Palo Alto, CA (US); Kenneth J Eldredge, Boise, ID (US); Lung T Tran, Saratoga, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/827,114

(22) Filed: Apr. 5, 2001

Related U.S. Application Data

(63) Continuation of application No. 09/564,713, filed on May 3, 2000, now Pat. No. 6,256,224.

(51) Int. Cl.[7] .................................................. G11C 5/08
(52) U.S. Cl. ......................................... 365/66; 365/173
(58) Field of Search ..................... 365/173, 66, 230.06, 365/63, 129, 230.01

(56) References Cited

U.S. PATENT DOCUMENTS

| 3,984,815 | A | * | 10/1976 | Drexier et al. ................ 377/20 |
| 4,805,146 | A | * | 2/1989 | Bruder et al. ................ 365/131 |
| 5,640,343 | A | * | 6/1997 | Gallagher et al. ........... 365/171 |
| 5,793,697 | A | * | 8/1998 | Sheuerlein ............. 365/203.07 |
| 6,055,178 | A | * | 4/2000 | Naji ........................... 365/158 |

* cited by examiner

Primary Examiner—Hoai V. Ho

(57) ABSTRACT

A write circuit for a large array of memory cells of a Magnetic Random Access Memory ("MRAM") device. The write circuit can provide a controllable, bi-directional write current to selected word and bit lines without exceeding breakdown limits of the memory cells. Additionally, the write circuit can spread out the write currents over time to reduce peak currents.

14 Claims, 6 Drawing Sheets

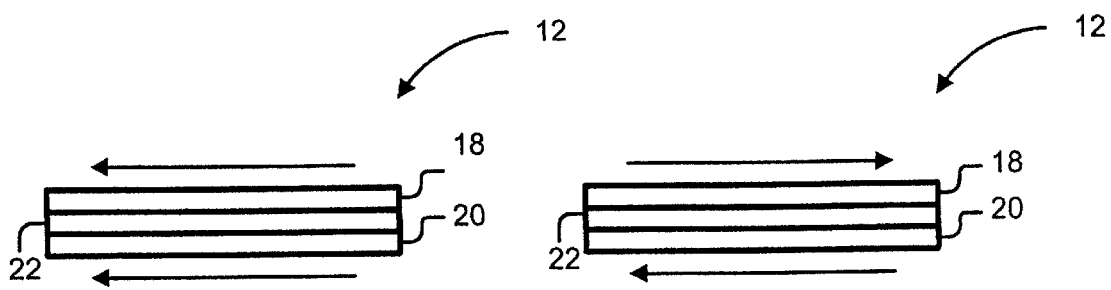
FIG. 2a  FIG. 2b
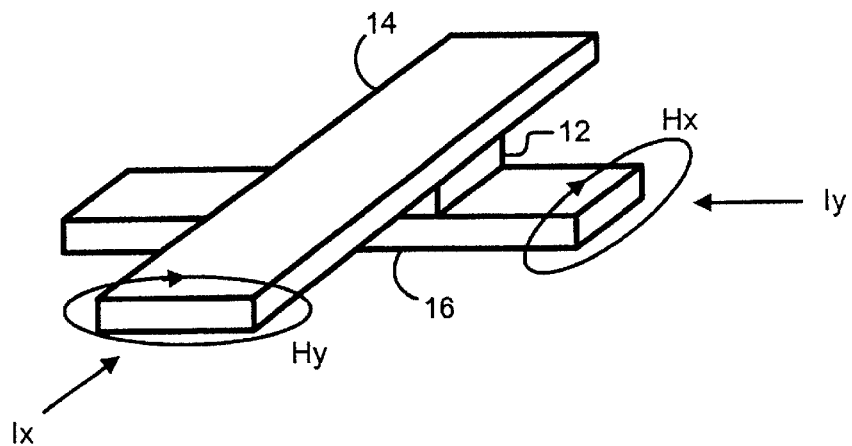
FIG. 3

WRITE CIRCUIT FOR LARGE MRAM ARRAYS

REFERENCE TO CROSS-RELATED APPLICATION

This is a continuation of U.S. Ser. No. 09/564,713 filed on May 3, 2000, now issued as U.S. Pat. No. 6,256,224.

BACKGROUND OF THE INVENTION

The invention relates to random access memory for data storage. More specifically, the invention relates to a magnetic random access memory device including an array of memory cells and circuitry for writing data to the memory cells.

Magnetic Random Access Memory ("MRAM") is a type of non-volatile memory that is being considered for long-term data storage. Accessing data from MRAM devices would be orders of magnitude faster than accessing data from conventional long-term storage devices such as hard drives. Additionally, the MRAM devices would be more compact and would consume less power than hard drives and other conventional long-term storage devices.

A typical MRAM device includes an array of memory cells. Word lines extend along rows of the memory cells, and bit lines extend along columns of the memory cells. Each memory cell is located at a cross point of a word line and a bit line.

Each memory cell stores a bit of information as an orientation of a magnetization. The magnetization orientation of each memory cell can assume one of two stable orientations at any given time. These two stable orientations of magnetization, parallel and anti-parallel, represent logic values of "1" and "0."

A write operation on a selected memory cell is performed by supplying write currents to the word and bit lines crossing the selected memory cell. The write currents induce an external magnetic field that sets the orientation of magnetization in the selected memory cell. The magnetization orientation is determined by the direction of the external magnetic field. The direction of the external magnetic field, in turn, is determined by the direction of the write currents flowing through the word and bit lines.

Data is typically written to the MRAM array as n-bit words. For instance, a 16-bit word might be written to sixteen memory cells by supplying a write current to a word line crossing the sixteen memory cells and supplying separate write currents to the sixteen bit lines crossing the sixteen memory cells.

There are a number of challenges to designing a write circuit for a large MRAM array. One challenge is reducing peak write currents without degrading the write performance of the MRAM array. High peak currents can overstress parts of the write circuit and generate unacceptable levels of current noise. Moreover, high peak currents can damage the memory cells.

Another challenge is controlling the write currents to a specified range. The write currents should be controlled to a specified range in order to perform reliable write operations. Too small a write current might not cause a selected memory cell to change its orientation of magnetization, and too large a write current will disturb unselected memory cells.

This challenge is complicated by the need for a write current that is bi-directional. Typically, bit line current flows in one direction to set a parallel magnetization orientation, and it flows in an opposite direction to set an anti-parallel magnetization orientation.

This challenge is further complicated by resistive cross-coupling between the memory cells. Each memory cell may be represented as a resistive element, and the stored data may be represented by a small differential resistance. In an MRAM array, each resistive element is coupled to other resistive elements. The write currents can be affected by resistive cross-coupling of the selected memory cell with unselected memory cells.

SUMMARY OF THE INVENTION

These design challenges are met by the present invention. According to one aspect of the present invention, an MRAM device includes a write circuit that writes a data word to a plurality of memory cells by supplying a write current to a word line crossing the memory cells, and supplying current pulses to bit lines crossing the memory cells. At least some current pulses are supplied to the bit lines in a staggered sequence. Consequently, peak write current is reduced.

According to another aspect, a write circuit applies write currents to selected word and bit lines and connects both ends of each unselected line to a high impedance. Consequently, effects of resistive cross-coupling, such as parasitic currents, are reduced and the write currents are controlled to a specified range.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 2a and 2b are illustrations of magnetization orientations of an SDT junction memory cell;

FIG. 3 is an illustration a memory cell and its crossing word and bit lines during a write operation;

DETAILED DESCRIPTION OF THE INVENTION

Figure 1:
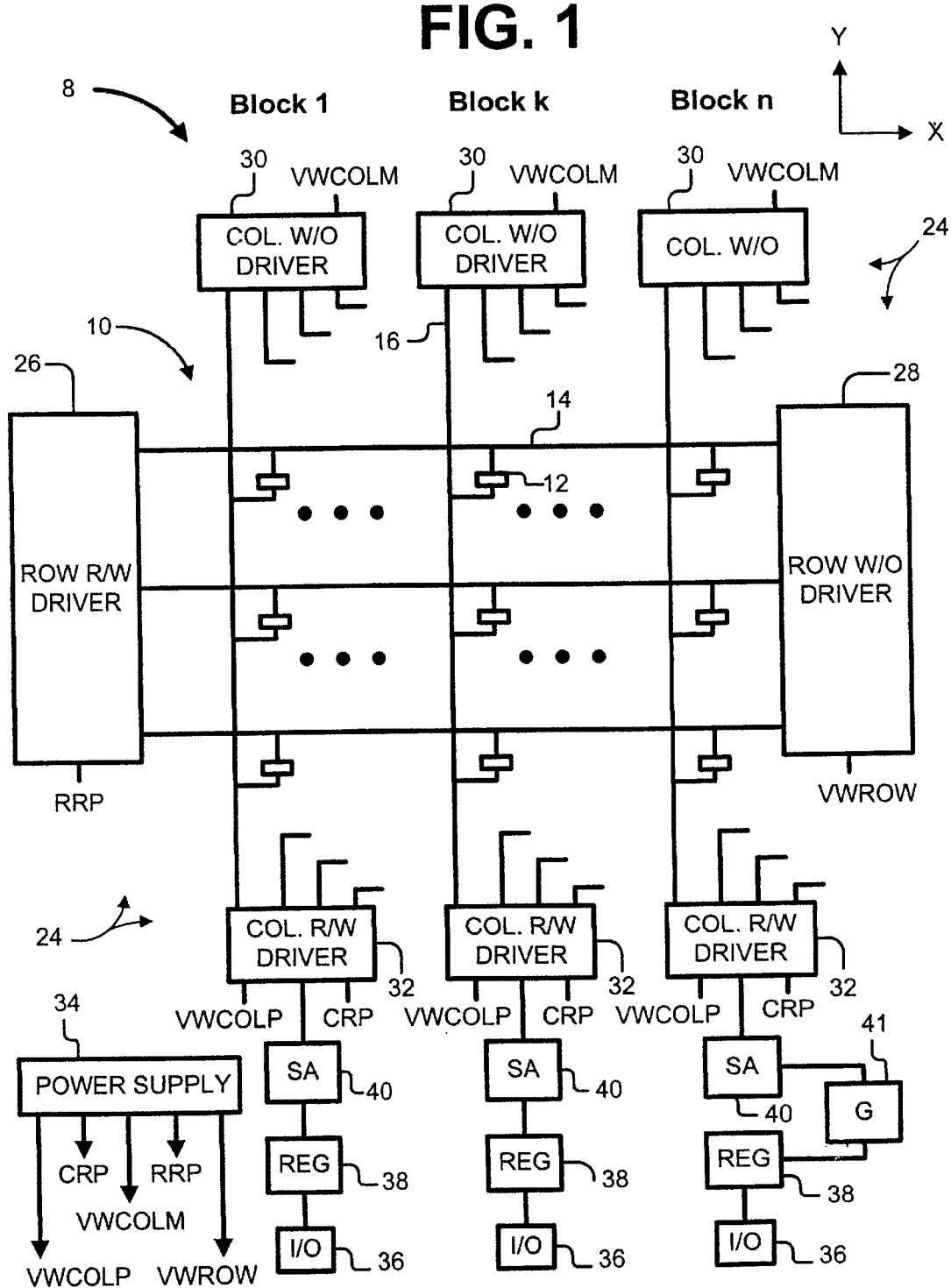
FIG. 1 is an illustration of an MRAM device including an array of memory cells and a write circuit in accordance with the present invention.

As shown in the drawings for purposes of illustration, the present invention is embodied in an MRAM device including a write circuit and an array of memory cells. The write circuit can provide a controllable, bi-directional write current to selected word and bit lines without exceeding breakdown limits of the memory cells, Consequently, the write circuit improves reliability of storing data in the memory cells without overstressing the circuitry or damaging the memory cells. The write circuit can also reduce peak current. Reducing the peak current is especially desirable for highly parallel modes of operation (erg., 64-bit wide operations, 128-bit wide operations). The write circuit also has a built-in test feature that improves observeability of its column write drivers.

Reference is now made to FIG. 1 which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, the array 10 may be of any size.

Traces functioning as word lines 14 extend along the x-direction in a plane on opposite sides of the memory cell array 10. Traces functioning as bit lines 16 extend along the y-direction in a plane on opposite sides of the memory cell array 10. There may be one word line 14 for each row of the array 10 and one bit line 16 for each column of the array 10. Each memory cell 12 is located at a cross point of a word line 14 and bit line 16.

The memory cells 12 are not limited to any particular type of device. For example the memory cells 12 may be spin dependent tunneling ("SDT") junction devices.

Referring now to FIGS. 2a and 2b, a typical SDT junction device 12 includes a pinned layer 20 having a magnetization that is oriented in the plane of the pinned layer 20 but fixed so as not to rotate in the presence of an applied magnetic field in a range of interest. The SDT junction device 12 also includes a "free" layer 18 having a magnetization orientation that is not pinned. Rather, the magnetization can be oriented in either of two directions along an axis (the "easy" axis) lying in the plane of the free layer 18. If the magnetization of the free and pinned layers 18 and 20 are in the same direction, the orientation is said to be "parallel" (as indicated by the arrows in FIG. 2a). If the magnetization of the free and pinned layers 18 and 20 are in opposite directions, the orientation is said to be "anti-parallel" (as indicated by the arrows in FIG. 2b).

The free and pinned layers 18 and 20 are separated by an insulating tunnel barrier 22. The insulating tunnel barrier 22 allows quantum mechanical tunneling to occur between the free and pinned layers 18 and 20. This tunneling phenomenon is electron spin dependent, making the resistance of the SDT junction device 12 a function of the relative orientations of the magnetization of the free and pinned layers 18 and 20. For instance, resistance of an SDT junction device 12 is a first value R if the orientation of magnetization of the free and pinned layers 18 and 20 is parallel and a second value R+ΔR if the magnetization of orientation is anti-parallel.

Additional reference is now made to FIG. 3, which illustrates a selected memory cell 12 during a write operation. The magnetization in the free layer 18 of the selected memory cell 12 is oriented by applying write currents Ix and Iy to both the selected word line 14 and bit line 16, which cross the selected memory cell 12. Applying the current Ix to the word line 14 causes a magnetic field Hy to form around the word line 14. Applying the current Iy to the bit line 16 causes a magnetic field Hx to form around the bit line 16. When sufficiently large currents Ix and Iy are passed through these selected lines 14 and 16, the combined magnetic field in the vicinity of the free layer 18 causes the magnetization of the free layer 18 to rotate from the parallel orientation to the anti-parallel orientation, or vice-versa. The current magnitudes are selected so that the combined magnetic field exceeds the switching field of the free layer 18 but does not exceed the switching field of the pinned layer 20. Thus, applying both magnetic fields Hx and Hy causes the magnetization orientation of the free layer 18 to switch.

Direction of the bit line current Iy will determine the magnetization orientation of the free layer 18. For example, a sufficient positive bit line current Iy will cause the magnetization orientation to be parallel, whereas a sufficient negative bit line current Iy will cause the magnetization orientation to be anti-parallel.

Returning to FIG. 1, the MRAM device 8 further includes a write circuit 24 for performing write operations on selected memory cells 12. The write circuit 24 includes a row read/write ("R/W") driver 26 and a row write-only ("W/O") driver 28. The write circuit 24 further includes a plurality of column W/O drivers 30, a plurality of column R/W drivers 32 and a power supply 34. The power supply 34 provides a first column write potential VWCOLM to each column W/O driver 30, a second column write potential VWCOLP to each column R/W driver 32, and a row write potential VWROW to the row W/O driver 28. The power supply further provides a row read potential RRP to the row R/W driver 26 and a column read potential CRP to each column R/W driver 32.

The drivers 26 to 32 supply the write currents Ix and Iy to selected word and bit lines 14 and 16 during a write operation on a selected memory cell 12. Each pair of column W/O and R/W drivers 30 and 32 supplies a bit line write current to a block (i.e., multiple columns) of memory cells. For example, in an array 10 having n=18 blocks of memory cells and eighteen pairs of column drivers 30 and 32, bit line currents will be supplied to eighteen bit lines during a write operation. Different pairs of column drivers 30 and 32 provide bit line currents to different blocks of memory cells 12.

Data to be written to the memory cells 12 is supplied to the MRAM device 8 via I/O pads 36 and stored in data registers 38 (although FIG. 1 shows only one data register 38 per I/O pad 36, it is understood that the device 8 may include multiple data registers 38 per I/O pad 36, whereby data would be supplied serially to an I/O pad 36 and de-multiplexed into different data registers 38). Each pair of column drivers 30 and 32 performs a write operation on a block of memory cells 12. At any given time, the column driver pair 30 and 32 writes to only a single memory cell 12 in a block.

The write circuit 24 can write to all of the blocks simultaneously. However, the write circuit 24 can also write to the blocks in a staggered sequence. Writing to the blocks in a staggered sequence offers the advantage of spreading out the current over time and thereby reducing current peaks. Consider a first example in which sixteen blocks are written to simultaneously, a second example in which sixteen blocks are written to in a staggered sequence at non-overlapping time intervals (e.g., one at a time), and a third example in which blocks are written to two at a time. Assume that word and bit line write currents of one milliamp are sufficient to set the magnetization orientation of each memory cell. In the first example, writing to all sixteen blocks simultaneously will result in a bit line write current of sixteen milliamps. In the second example, however, the bit line write current is a maximum of one milliamp because the selected memory cells are written to one at a time. Moreover, the peak current is lower in the second example than in the first example. In the third example, the bit line write current is a maximum of two milliamps, which is less than the maximum peak current in the first example, but greater than the maximum peak current in the second example. However, the write time in the third example is faster than the write time in the second example.

The current variations and peak currents arise in part from process variations in the MRAM device 8. Different memory cells will have a different resistances, different word and bit lines will have different resistances, voltages applied to the different memory cells and lines will produce different currents, etc. Writing to multiple memory cells simultaneously will result in higher peak currents than writing to one memory cell at a time.

The row drivers 26 and 28 disconnect both ends of each unselected word line during a write operation, and the column drivers 30 and 32 also disconnect both ends of each unselected bit line during a write operation. Disconnecting both ends of unselected lines prevents the unselected lines from providing undesired paths to a reference potential or a write power supply. If an unselected line provides an undesired path during a write operation, parasitic currents will flow through the array. These parasitic currents can interfere with the write operation. However, by disconnecting both ends of each unselected line (e.g., connecting both ends to a high impedance), the relative magnitude of the parasitic currents is reduced so as not to interfere with a write operation.

During a read mode of operation on a selected memory cell 12, the row R/W driver 26 connects unselected word lines to a reference potential, and the column R/W driver 32 connects unselected bit lines to the reference potential REF. In the alternative, the row R/W driver 26 connects the selected word line to a row read potential RRP, and the column R/W driver 32 connects the selected bit line to a column read potential. Either way, a sense current flows through the selected memory cell 12. A sense amplifier 40 senses the resistance state of the selected memory cell 12 to determine the logic value stored in the selected memory cell 12. For example, the sense amplifier 40 can measure the sense current to determine whether the memory cell has a resistance of value R corresponding to the first state or a value R+ΔR corresponding to the second state. Corresponding data values are stored in the registers 38. The values stored in the data registers 38 are read out of the MRAM device 8 via the I/O pads 36.

The MRAM device 8 may use an "equi-potential" method to reduce the magnitude of parasitic currents and allow the sense current to be read reliably. The column R/W drivers 32 may provide the same potential to the unselected bit lines as the selected bit line, or the row R/W driver 26 may provide the same potential to the unselected word lines as the selected bit line. The equi-potential method is described in greater detail in U.S. Ser. No. 09/09/564,308 filed May 3, 2000 and incorporated herein by reference.

Figure 4:
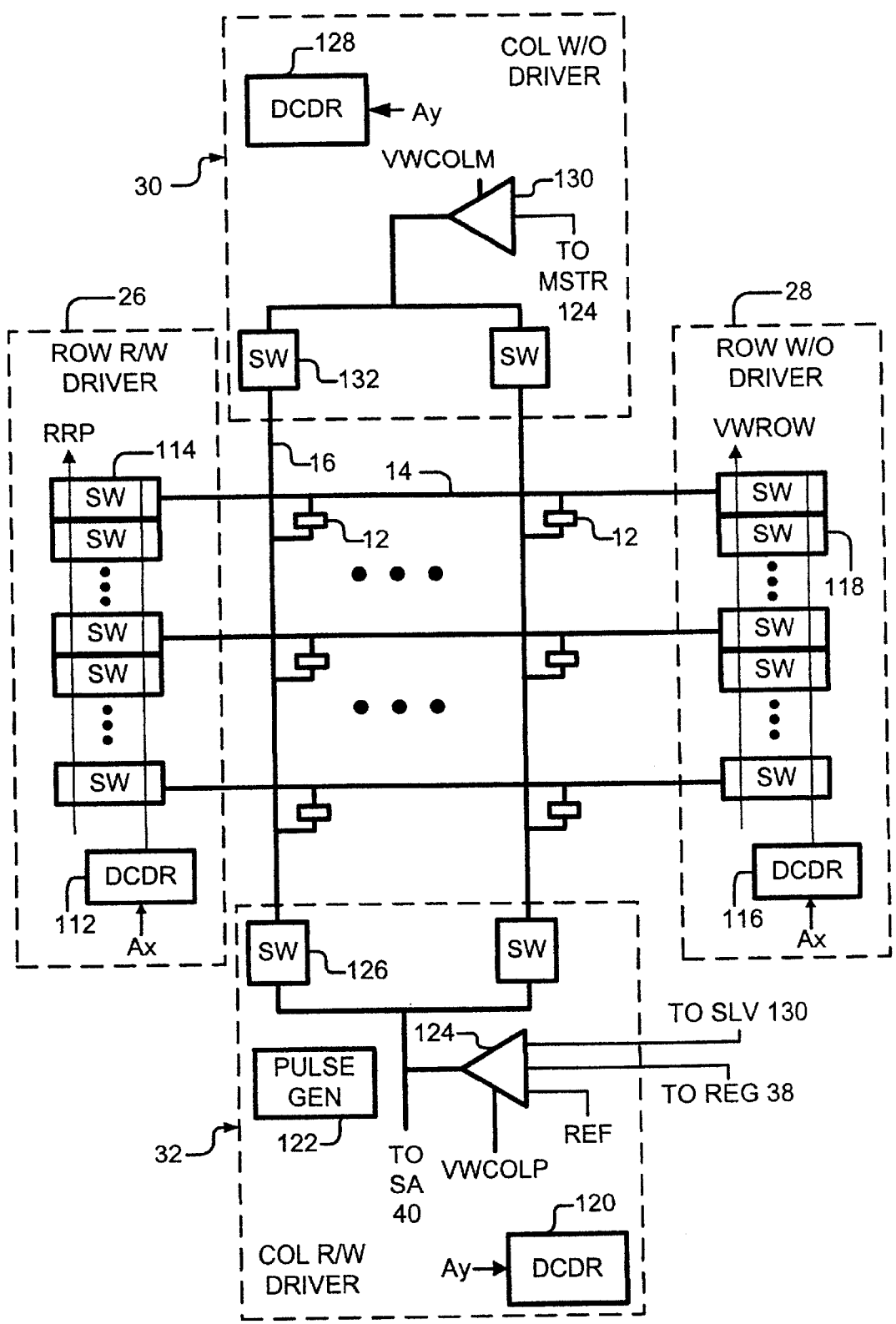
FIG. 4 is an illustration of a block of a write circuit and a corresponding block of memory cells.

Reference is now made to FIG. 4, which shows a pair of column drivers 30 and 32 for a block of memory cells 12. Also shown are the row drivers 26 and 28. The row R/W driver 26 may include a row R/W decoder 112 and a plurality of row R/W switches 114, one R/W switch 114 per memory cell row. The row R/W decoder 112 decodes a memory cell address Ax and causes each row R/W switch 114 to connect a first end of a word line to the row read potential, the reference potential, or a high impedance.

Figure 5A:
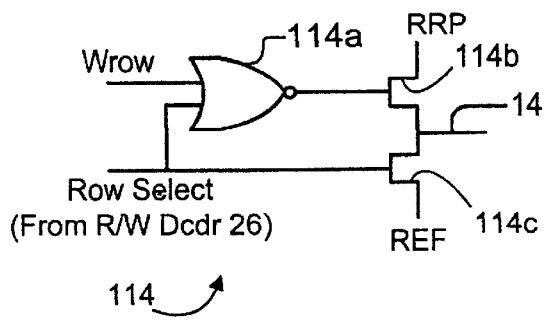
FIGS. 5 (a) to 5(d) are illustrations of row and column driver switches for the write circuit.

An exemplary row R/W switch 114 for the row R/W driver 26 is shown in FIG. 5a. The exemplary row R/W switch 114 can connect the first end of a selected word line to the row read potential (RRP) during both read and write operations, connect the first end of an unselected word line to the array reference potential (REF) during the read operation, and switch the first end of an unselected word line to high impedance during the write operation. "Wrow" denotes a global write enable signal. During the write operation, the global write enable signal Wrow goes Hi, which drives the output of a Nor gate 114a to a Lo state. The Lo state of the Nor gate output turns off an N-channel pullup transistor 114b, thereby forcing a high impedance connection between the word line 14 and the reference potential REF. If the row is unselected, a pulldown transistor 114c is also off, which results in a high impedance state for the row R/W switch 114.

Figure 5B:
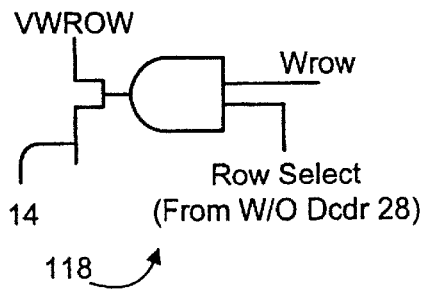

The row W/O driver 28 may include a row W/O decoder 116 and a plurality of row W/O switches 118, one row W/O switch 118 per memory cell row. The row W/O decoder 116 decodes the memory cell address Ax and causes each row W/O switch 118 to connect a second end of a word line to the row write potential VWROW or a high impedance. The second end of a selected word line is connected to the row write potential VWROW during a write operation and it is connected to a high impedance during a read operation. The second end of an unselected word line is connected to a high impedance during read and write operations. An exemplary row W/O switch 118 for the row W/O driver 28 is shown in FIG. 5b.

Figure 5C:
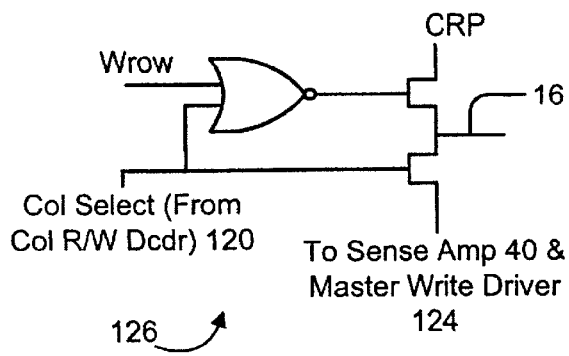

The column R/W driver 32 includes a column R/W decoder 120, a pulse generator 122, a column master write driver 124 and a plurality of column R/W switches 126, one column R/W switch 126 per memory cell column. The column R/W decoder 120 decodes a memory cell address Ay and causes the column R/W switches 126 to connect a first end of a selected bit line to the sense amplifier 40 and master write driver 124 during both read and write operations, connect the first ends of unselected bit lines to a column read potential (CRP) during read operations, and connect the first ends of unselected bit lines to a high impedance during write operations. An exemplary column R/W switch 126 for the column R/W driver 32 is shown in FIG. 5c.

Figure 5D:
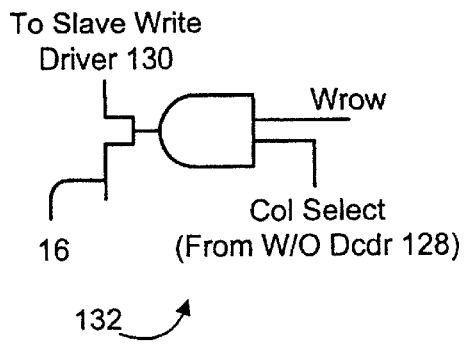

The column W/O driver 30 may include a column W/O decoder 128, a column slave driver 130, and a plurality of column W/O switches 132, one column W/O switch 132 per memory cell column, The column W/O decoder 116 decodes the memory cell address Ay and causes the column W/O switches 132 to connect the second end of the selected bit line to the slave write driver 130 and the second ends of unselected bit lines to a high impedance during the write operation. During a read operation, the column W/O decoder 128 causes the column W/O switches 132 to connect the second ends of the bit lines to a high impedance. An exemplary column W/O switch 132 is shown in FIG. 5d.

These switches 114, 118, 126 and 132 are used to reduce the relative magnitude of the parasitic currents so as not to interfere with the write operation. Thus, all four sides of the MRAM array use switches with control from either the row or column decoders 112, 116, 120 and 128. Simple switches are used on two sides to isolate the column write drivers 30 and 32 during the read operation, and a totem pole switch is used on the other two sides to allow the column write drivers 30 and 32 to switch between the write operation and an equi-potential read operation.

Figure 6:
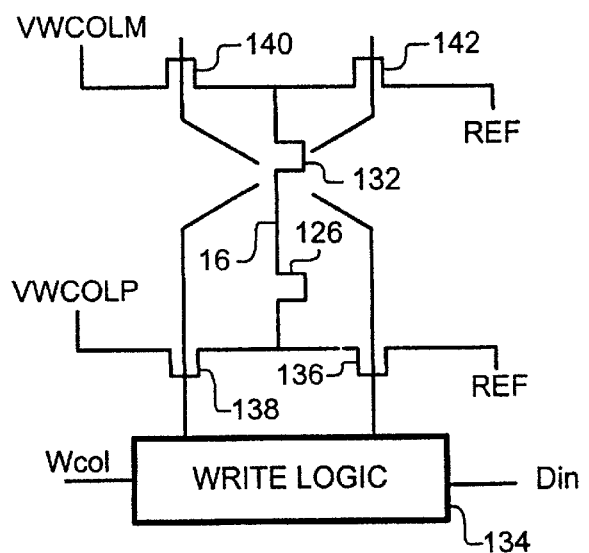
FIG. 6 is an illustration of a column master/slave write driver for the write circuit.

The column master and slave drivers 124 and 130 control the direction and duration of the write current during a write operation. Exemplary master and slave drivers 124 and 130 are shown in FIG. 6. The column master driver 124 includes driver logic 134 and a first pair of switches 136 and 138 having controlled current paths coupled between the second column write potential VWCOLP and the reference potential REF. The column slave driver 130 includes a second pair of switches 140 and 142 having controlled current paths coupled between the first column write potential VWCOLM and the reference potential.

When a column write enable signal Wcol goes Hi, the write logic 134 causes the column master and slave drivers 124 and 130 to apply a column write potential VWCOLP or VWCOLM to one end of a bit line and a reference potential REF to the other end of a bit line. The switches 136 to 142 of the master and slave drivers 124 and 130 work in a push-pull manner to establish the direction of the bit line current. For current to flow in one direction, the column slave driver 130 connects the selected bit line to the first column write potential VWCOLM and the column master driver 124 connects the selected bit line to the reference potential REF. For current to flow in the opposite direction, the column slave driver 130 connects the selected bit line to the reference potential REF and the column master driver 124 connects the selected bit line to the second write potential VWCOLP. The write logic selects the direction of the current flow according to the value of the data Din in the data register 38.

During a read operation, the column write enable signal Wcol is Lo, whereby the transistors of the master and slave write drivers 124 and 130 are turned off. The slave write driver 130 is isolated from the selected bit line by the column W/O switch 132. The master write driver 124 is isolated from the selected bit line by the high impedance state of the master write driver switches 136 and 138.

The four switches 136 to 142 of the master and slave drivers 124 and 130 develop the bi-directional write current with the properties of the lowest possible write voltage stress applied to the memory cell connected to the selected bit line. The write voltages will be set by sizing the write drivers and switches and resistance of the word and bit lines.

The column write enable signal Wcol may be a global signal that is supplied to each block (in which case the pulse generators 122 of the R/W drivers 32 could be replaced by a single pulse generator). The global column write enable signal Wcol would cause write pulses to be supplied simultaneously to the selected bit lines. Pulse width of the global column write enable signal would be long enough to set the directions of the stored magnetic fields in the selected memory cells.

In the alternative, the write pulses could be staggered. Pulses could be supplied one at a time, two at a time, etc., to spread the column write current pulses over a broad time period and thereby control the peak write currents. Each pulse generator 122 could generate a separate column write enable signal $Wcol_i$ (where $1 \leq i \leq n$ and n is the number of blocks in the array 10). Duration of the $i^{th}$ column write enable signal $Wcol_i$ would only be long enough to set the Width of the write column pulse and, therefore, the stored magnetic field in the selected memory cell of the $i^{th}$ block. A minimum write time may be on the order of one to ten nanoseconds.

Figure 7:
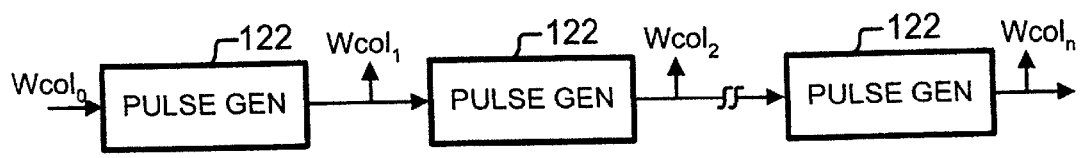
FIG. 7 is an illustration of a circuit for propagating a write enable signal between column read/write drivers.
Figure 8:
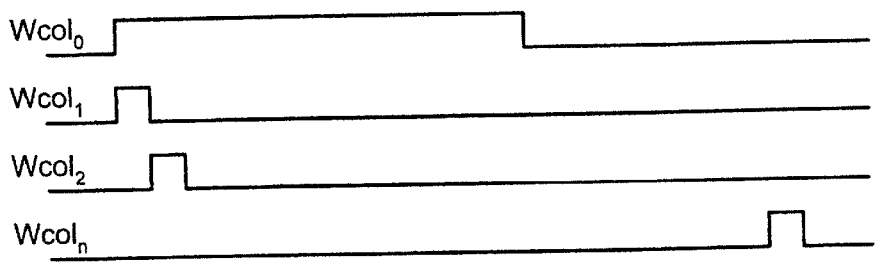
FIG. 8 is a timing diagram for the circuit of FIG. 7.

FIG. 7 shows how the pulse generators 122 of different R/W drivers 32 may be arranged to generate column write enable signals $Wcol_i$ that cause current pulses to be supplied one at a time to selected bit lines. A write operation is initiated by supplying a signal $Wcol_0$ to the pulse generator 122 of the first R/W driver 32. The signal $Wcol_0$ causes the pulse generator 122 of the first R/W driver 32 to generate a first pulse $Wcol_1$. The first pulse is the column write enable signal $Wcol_1$ for the column drivers 30 and 32 of the first block. The first pulse $Wcol_1$ is also supplied to the pulse generator 122 of the second R/W driver 32. A falling edge of the first pulse $Wcol_1$ causes the pulse generator 122 of the second R/W driver 32 to generate a second pulse $Wcol_2$. The second pulse is the column write enable signal $Wcol_2$ for the column drivers 30 and 32 of the second block. The $i^{th}$ pulse (that is, the ith column write enable signal $Wcol_i$), which is generated by the pulse generator 122 of the $i^{th}$ block, is supplied to the pulse generator 122 of the I+$1^{th}$ block. In this manner, the column write enable signals $Wcol_i$ are propagated across the pulse generators 122 (as shown in FIG. 8). As a result, the write pulses are propagated across the bit lines so that only one memory cell per block is written to at any given time.

The write circuit 22 may include a circuit for testing the column R/W drivers 32. The test circuit can generate a signal that is supplied to the last ($n^{th}$) data register 38 during the testing of the write circuit. The signal applied to the last data register 38 may be the pull down signal from the column master write driver 124 to the column slave write driver 130. Logically, the pull down signal is the data-in signal gated by the n, column write enable signal $Wcol_n$, which is generated by the pulse generator 122 of the last block. This test circuit is useful to observe the action of the column R/W drivers 32 during the write operation. The data-out is not used during the write operation and that test data may be multiplexed onto data-out signals during the write operation. The logic added for the write test feature may be a full CMOS transmission gate 41 placed in the data-out line from the $n^{th}$ sense amplifier to the $n^{th}$ data register 38 (see FIG. 1). The transmission gate 41 may be controlled by column write enable signals already present in the column master write driver circuit.

Figure 9:
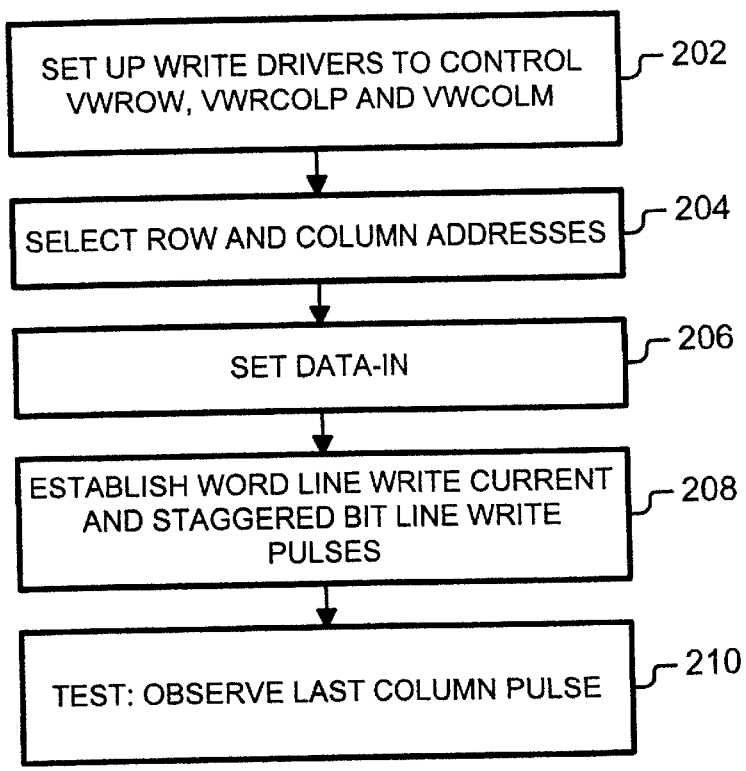
FIG. 9 is a flowchart of a method of using the write circuit to write to a block of memory cells.

FIG. 9 shows the operation of the column drivers 30 and 32 during a write operation. The write currents are set up and controlled by the three write potentials: VWROW, VWCOLP, and VWCOLM (block 202). Before a write operation begins, a row and a set of columns are selected by supplying addresses Ax and Ay to the row and column decoders 112, 116, 120 and 128 (block 204). Data stored in the data registers 38 is applied to the column: R/W drivers 32 (block 206). The global write enable signal Wrow is asserted to establish a word line write current in a selected word line, and the column write enable signal $Wcol_0$ is asserted, causing write pulses to be supplied, one at a time, to the selected bit lines, starting with the bit line of the first block and ending with the bit line of the last block (block 208). The output from the pulse generator 122 of the last ($n^{th}$) R/W driver 32 may be observed to determine when the write operation has completed (block 210). The process may be repeated for all write operations.

Figure 10:
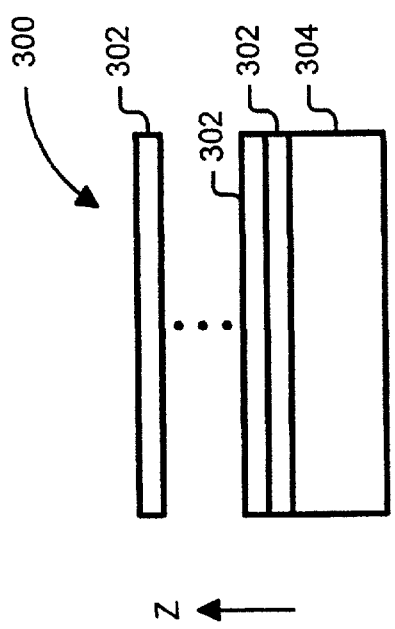
FIG. 10 is an illustration of an MRAM chip in accordance with the resent invention.

Reference is now made to FIG. 10, which illustrates a multi-level MRAM chip 300. The MRAM chip 300 includes a number N of memory cell levels 302 that are stacked in a z-direction on a substrate 304. $N \geq 1$, where N is a positive integer. The memory cell levels 302 may be separated by insulating material (not shown) such as silicon dioxide. Read and write circuits may be fabricated on the substrate 304. The read and write circuits may include additional multiplexers for selecting the levels that are read from and written to.

Thus disclosed is write circuit for large MRAM arrays. The write circuit can provide a controllable, bi-directional write current pulses to selected word and bit lines without exceeding breakdown limits of the memory cells. Consequently, the write circuit improves reliability of storing data in the memory cells without overstressing the circuitry or damaging the memory cells. The write circuit can spread out current pulses over time to reduce peak currents. Reducing peak currents reduces power consumption and heat dissipation. Reducing the peak currents is especially desirable for highly parallel modes of operation.

The write circuit is compatible with read circuitry that applies an equal potential to selected and unselected lines during a read operation. The write circuit has a built-in test feature that improves observeability of the column write drivers. Because observeability of the states of the internal nodes, test coverage of the write circuit is improved.

Figure 11:
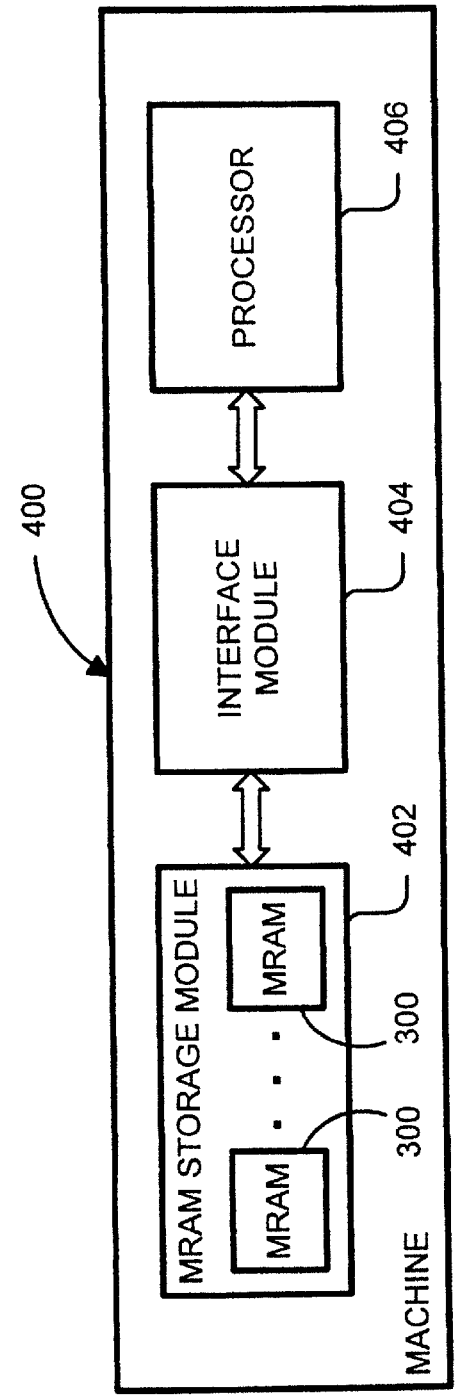
FIG. 11 is an illustration of a machine including one or more MRAM chips.

The MRAM device according to the present invention may be used in a wide variety of applications. FIG. 11 shows an exemplary general application for one or more MRAM chips 300. The general application is embodied by a machine 400 including an MRAM storage module 402, an interface module 404 and a processor 406. The MRAM storage module 402 includes one or more MRAM chips 300 for long term storage. The interface module 404 provides an interface between the processor 406 and the MRAM storage module 402. The machine 400 could also include fast volatile memory (e.g., SRAM) for short term storage.

For a machine 400 such as a notebook computer or personal computer, the MRAM storage module 402 might include a number of MRAM chips 300 and the interface module 404 might include an EIDE or SCSI interface. For a machine 400 such as a server, the MRAM storage module 404 might include a greater number of MRAM chips 300, and the interface module 404 might include a fiber channel or SCSI interface. Such MRAM storage modules 402 could replace or supplement conventional long terms storage devices such as hard drives.

For a machine 400 such as a digital camera, the MRAM storage module 402 might include a smaller number of MRAM chips 300 and the interface module 404 might include a camera interface. Such an MRAM storage module 402 would allow long term storage of digital images on-board the digital camera.

The MRAM device according to the present invention offers many advantages over conventional long-term data storage devices such as hard drives. Accessing data from the MRAM devices is orders of magnitude faster than accessing data from conventional long-term storage devices such as hard drives. Additionally, MRAM devices are more compact than hard drives.

The MRAM device is not limited to the specific embodiments described and illustrated above. For instance, the memory cells are not limited to SDT junction devices. Other types of devices that could be used include, but are not limited to, giant magnetoresistance ("GMR") devices.

The MRAM array has been described in connection with the rows being oriented along the easy axis. However, the rows and columns could be transposed, in which case the columns would be oriented along the easy axis.

The row and column drivers are not limited to the switches shown in FIGS. 5a to 5d. However, the switches shown in FIGS. 5a to 5d may be implemented with NMOS transistors, which support a low voltage design and a high-density layout.

The power supply may be implemented in any number of ways. For example, the power supply may include variable voltage sources for providing the different potentials. In the alternative, controlled current sources may include high impedance controlled current sources or current mirrors.

The pulse generators 122 may be made part of the R/W drivers 32, as shown in FIG. 4. In the alternative, the column write enable signals Wcol$_i$ may be externally generated.

Circuits other than multiple pulse generators may be used for generating the column write enable signals. For instance, the column write enable signals may be generated by one or more shift registers (e.g., a single shift register could create write enable signals one at a time; two shift registers operating in parallel could create write enable signals two at a time).

Thus, write operations may be performed one bock at a time, two blocks at a time, etc. Each additional write pulse will increase the peak bit line current. However, each additional write pulse will also increase write speed. Thus, the designer is faced with a trade off of increasing write speed versus reducing peak write current to an acceptable level.

Accordingly, the invention is not limited to the specific embodiments described and illustrated above. Instead, the invention is construed according to the claims that follow.

What is claimed is:

1. A method of writing data to an array of memory cells, selected memory cells being crossed by a selected first line and different selected second lines, additional memory cells in the array being crossed by unselected lines, the method comprising the steps of:

supplying a first write current to the selected first line;

supplying a second write current to the selected second line; and connecting both ends of the unselected lines to a high impedance.

2. An MRAM device comprising:

an array of memory cells;

a plurality of word lines crossing the memory cells;

a plurality of bit lines crossing the memory cells; and a write circuit including a plurality of first and second switches for coupling first and second ends of unselected word lines to a high impedance during a write operation; and a plurality of third and fourth switches for coupling first and second ends of unselected bit lines to a high impedance during a write operation.

3. A circuit for an MRAM device, the MRAM device including an array of memory cells, a plurality of bit lines crossing columns of the memory cells and a plurality of word lines crossing rows of the memory cells, the circuit comprising:

a plurality of first and second switches for coupling first and second ends of unselected word lines to a high impedance during a write operation; and a plurality of third and fourth switches for coupling first and second ends of unselected bit lines to a high impedance during the write operation.

4. The circuit of claim 3, wherein one of the first switches applies a reference potential to the first end of a selected word line during a write operation; wherein one of the second switches applies a row write potential to the second end of a selected word line during a write operation; wherein one of the third switches applies one of a reference potential and a first column write potential to the first end of a selected bit line during a write operation; and wherein one of the fourth switches applies one of a reference potential and the second column write potential to the second end of a selected bit line during a write operation.

5. The circuit of claim 4, further comprising a push-pull circuit for applying the write potentials to the third and fourth switches.

6. The circuit of claim 3, wherein the first and second switches are configured to supply a unidirectional write current to the word lines, and the third and fourth switches are configured to supply a bi-directional write current to the bit lines.

7. The circuit of claim 6, further comprising a single current source connected to the first switches.

8. The circuit of claim 3, wherein the third switches are part a slave driver and wherein the fourth switches are part of a master driver, the master and slave drivers applying bi-directional write currents to selected bit lines during a write operation.

9. The circuit of claim 8, wherein current is caused to flow in one direction by the slave driver connecting a selected bit line to a first write potential and the master driver connecting the selected bit line to a reference potential; and wherein current is caused to flow in the opposite direction by the slave driver connecting the selected bit line to the reference potential and the master driver connecting the selected bit line to the second write potential.

10. The circuit of claim 8, further comprising sense amplifiers for the bit fines, the column driver connecting a first end of a selected bit line to the sense amplifier and master write driver during both read and write operations, connecting ends of unselected bit lines to a read potential during read operations, and connecting the ends of unselected bit lines to a high impedance during write operations.

11. The circuit of claim 3, wherein the second switches are part of row read/write drivers and the fourth switches are part of column R/W drivers, one of the row and column read/write drivers providing the same potential to unselected lines as a selected line during read operations.

12. A circuit for writing data to an array of memory cells, selected memory cells crossed by a selected first line and different selected second lines, additional memory cells in the array crossed by unselected lines, the circuit comprising:

switches for causing a first write current to flow through the selected first line and a second write current to flow through the selected second lines; and means for connecting both ends of the unselected lines to a high impedance.

13. The circuit of claim 12, further comprising sense amplifiers for sensing logic states of selected memory cells; the means coupling first ends of selected second lines to the sense amplifiers during read operations, the means connecting ends of subsets of unselected first and second lines to a read potential during the read operations.

14. The circuit of claim 13, further comprising sense amplifiers for the bit lines, a first end of each selected bit line being supplied with an operating potential during read operations, ends of a subset of unselected word and bit lines being supplied with an equal potential during read operations.

* * * * *